United States Patent
Huang et al.

[11] Patent Number: 6,111,752
[45] Date of Patent: Aug. 29, 2000

[54] DEVICE FOR FASTENING A HEAT SINK TO A HEAT-GENERATING ELECTRICAL COMPONENT

[75] Inventors: Chung-Yuan Huang, Austin, Tex.; Wei-Ta Lo, Miou-Li, Taiwan

[73] Assignee: Foxconn Precision Components Co., Ltd., Taipei Hsien, Taiwan

[21] Appl. No.: 09/452,569

[22] Filed: Dec. 10, 1999

[51] Int. Cl.[7] .................................................. H05K 7/20
[52] U.S. Cl. ........................ 361/704; 361/704; 361/707; 257/718; 257/719; 165/80.2; 165/80.3; 174/16.3; 24/625; 248/505
[58] Field of Search .................................. 361/704, 707, 361/709, 710, 717–719; 24/625; 257/718, 719, 726, 727; 174/16.3; 165/80.2, 80.3; 248/505

[56] References Cited

U.S. PATENT DOCUMENTS

| | | | |
|---|---|---|---|
| 5,304,735 | 4/1994 | Earl et al. ................................ | 174/16.3 |
| 5,486,981 | 1/1996 | Blomquist ................................ | 361/704 |
| 5,600,540 | 2/1997 | Blomquist ................................ | 361/704 |
| 5,771,960 | 6/1998 | Lin ........................................... | 165/80.3 |
| 5,791,403 | 8/1998 | Chiou ....................................... | 165/80.3 |
| 5,825,622 | 10/1998 | Rife et al. ................................ | 361/704 |
| 5,898,571 | 4/1999 | Mertol ..................................... | 361/704 |
| 5,933,325 | 8/1999 | Hou ......................................... | 361/704 |
| 5,933,326 | 8/1999 | Lee et al. ................................. | 361/704 |

*Primary Examiner*—Leo P. Picard
*Assistant Examiner*—Boris L. Chervinsky
*Attorney, Agent, or Firm*—Wei Te Chung

[57] ABSTRACT

A clip for fastening a heat sink to a CPU mounted on a ZIF connector is made by stamping a metal sheet. The clip has an elongated body portion for pressing the heat sink toward the CPU. A first arm extends downward from a first end of the body portion and defines a hole about its free end for fitting with a first lug of the connector. A second arm extends downward from a second end of the body portion and defines a hole about its free end for fitting with a second lug of the connector. A handle portion is formed by plastic injection molding to be fixed to upper end of the second arm. The handle portion is used for receiving a manipulating force of the clip exerted directly by fingers of an operator. A pair of tabs integrally formed with the second arm is located below the handle portion and projects toward each other. A tool may be used to extend to abut the tabs via the handle portion, whereby the manipulating force of the clip may be exerted to the clip through the tool.

11 Claims, 5 Drawing Sheets ically contacted with the CPU mounted on a ZIF connector by a fastening device, wherein the fastening device is in the form of a clip having a first end engaging with a first lug on the connector, an opposite second end engaging with a second lug on the connector and an elongate body portion between the first and second ends pressing the heat sink against the CPU.

DEVICE FOR FASTENING A HEAT SINK TO A HEAT-GENERATING ELECTRICAL COMPONENT

BACKGROUND OF THE INVENTION

Field of the Invention

The present invention is related to a device for fastening a heat sink to a heat-generating device, and particularly to a clip for fastening a heat sink to a central processing unit (hereafter, "CPU") mounted on a Zero-Insertion-Force connector (hereafter, "ZIF connector").

As the consuming power of a CPU becomes greater and greater, the CPU gets hotter and hotter. Should the heat not be dissipated timely and properly, a malfunction or unreliability of the CPU will happen. To overcome this problem, a heat sink made of aluminum stock is used to contact with the CPU whereby heat can be absorbed by the heat sink and dissipated to the surrounding environment. The heat sink is tightly contacted with the CPU mounted on a ZIF connector by a fastening device, wherein the fastening device is in the form of a clip having a first end engaging with a first lug on the connector, an opposite second end engaging with a second lug on the connector and an elongate body portion between the first and second ends pressing the heat sink against the CPU.

FIG. 1 is a drawing copied from U.S. Pat. No. 5,671,118 illustrating a conventional clip 50 for fastening a heat sink 12 to a CPU 10 mounted on a ZIF connector 4. The connector 4 is usually soldered to a mother board (not shown). The clip 50 has a first end 502 engaging with a first lug 42 of the connector 4, an opposite second end 504 engaging with a second lug 44 of the connector 4 and an elongate body portion 56 between the ends 502, 504 pressing the heat sink 12 toward the CPU 10 to has the heat sink 12 intimately contacted with the CPU. A finger manipulating portion 508 is formed by the clip 50 at a top of the second end 504 whereby a user can directly use his (her) fingers to achieve/release the engagement between second end 504 of the clip 50 and the second lug 44. Thus, the heat sink 12 can be mounted to/dismounted from the CPU 10 for the purpose of replacement or maintenance.

Since the layout of some mother boards has electronic components (such as capacitors) located around the finger operating portion 508, which causes the access of the user's fingers to this portion to be difficult or even impossible, resulting in an operational difficulty in achieving/releasing the engagement between the second end 504 of the clip 50 and the second lug 44 of the connector 4.

FIG. 2 is a drawing copied from Taiwan Patent Application No. 83218065, disclosing a clip 5 for achieving the same function as the clip 50 of U.S. Pat. No. 5,671,118. The clip 5 has a first end 53 defining a lower hole 54, an upper hole 56 and a rib 57 between the two holes 54, 56. A second end 53' defines a lower hole 54', an upper hole 56' and a rib 57' between the two holes 54', 56'. The clip 5 further has an elongate body portion 51 between the two ends 53, 53' for pressing the heat sink toward the CPU. The lower holes 54, 54' are used for fitting with the lugs of the connector. To release the engagement between the clip 5 and the connector, a tip of a tool, for example, a flat screwdriver, is extended through one of the upper holes 56 (56') to abut against a corresponding rib 57 (57'). Then, a force is exerted to the rib 57 (57') by the screwdriver to cause the corresponding end 53 (53') to deflect away from the corresponding lug, whereby the engagement between the corresponding lower hole 54 (54') and the lug is released. Thus, the heat sink and the CPU can be detached from the connector for replacement or maintenance.

To use a tool is not so convenient than directly use the fingers. However, in some circumstances, the use of a tool to manipulate the clip is unavoidable.

Hence, an improved clip is needed to eliminate the above mentioned defects of current clips.

SUMMARY OF THE INVENTION

Accordingly, an objective of the present invention is to provide a device for fastening a heat sink to a CPU, wherein the fastening device can be conveniently manipulated by a user's fingers directly, or via a tool.

To fulfill the above mentioned objective, according to one embodiment of the present invention, a clip for fastening a heat sink to a CPU mounted on a ZIF connector is formed to have an elongated body portion, a first arm and a second arm. The first arm extends downward from a first end of the body portion for firmly engaging with a first lug of the connector. The second arm extends downward from a second end of the body portion for firmly engaging with a second lug of the connector. The body portion tightly presses the heat sink against the CPU. A handle portion is located on the an upper end of the second arm whereby a user can directly use his (her) fingers to manipulate the clip. A pair of tabs projects from lateral side edges of the second arm toward each other, and is located below the handle portion. The user can use a tool, for example, a flat screwdriver to manipulate the clip by abutting a blade of the screwdriver against the tabs and then exerting a force on the second arm to cause it to disengage from the second lug. Thus, the clip in accordance with the present invention can be manipulated by a user directly using fingers or via a tool.

DETAILED DESCRIPTION OF THE PREFERRED EMBODIMENTS

Reference will now be made in detail to the preferred embodiments of the present invention.

Figure 1:
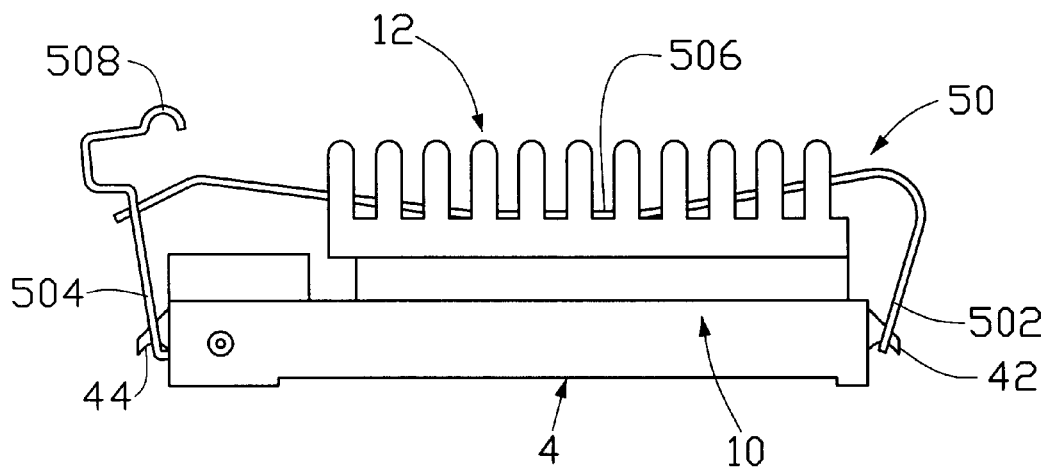
FIG. 1 is an elevational view showing a first prior art clip attaching a heat sink to a CPU mounted on a ZIF connector.
Figure 2:
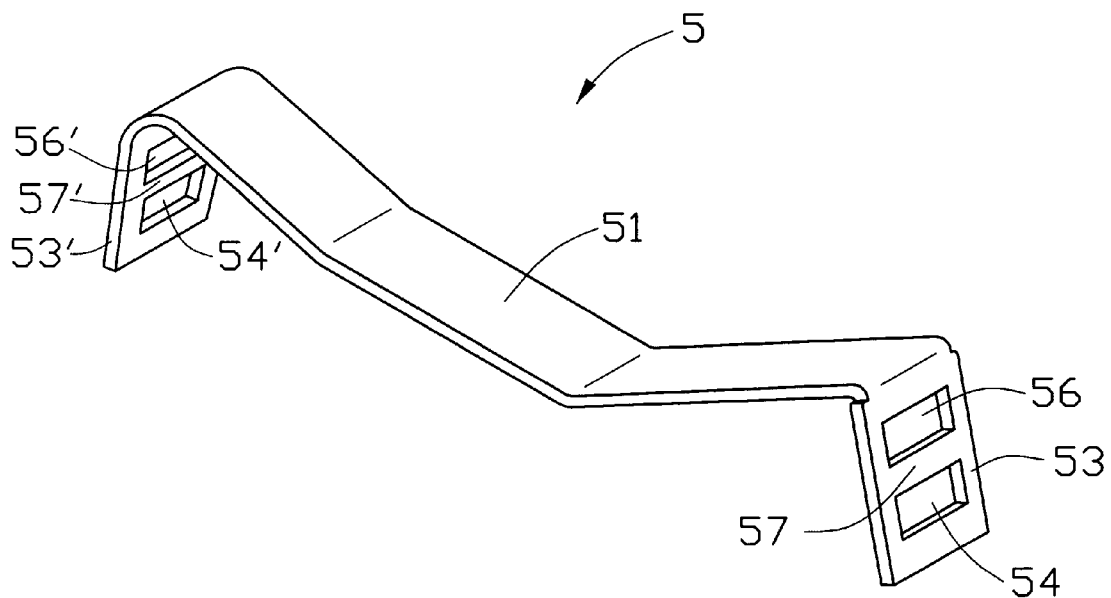
FIG. 2 is a perspective view of a second prior art clip.
Figure 3:
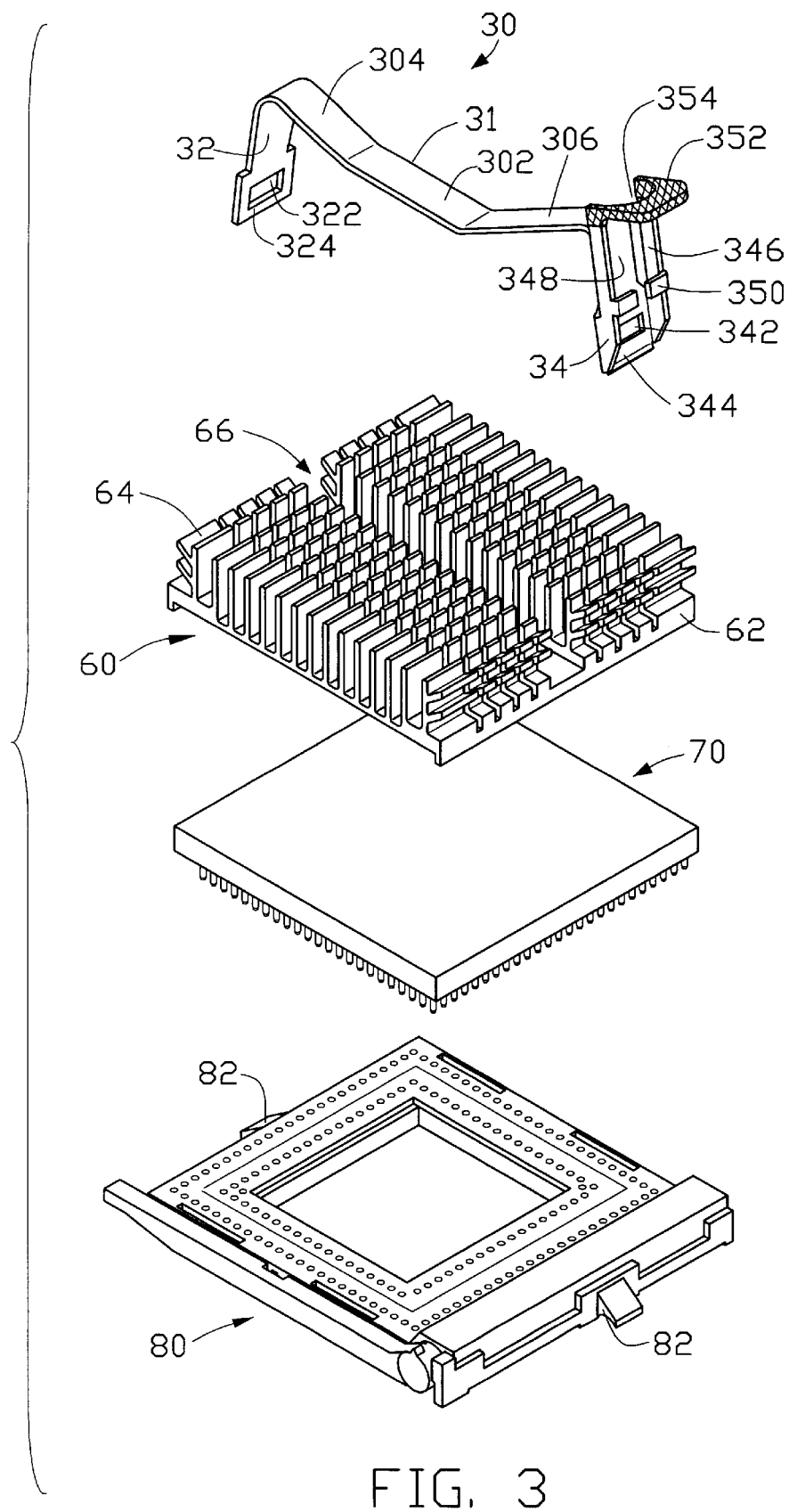
FIG. 3 is an exploded view showing a clip in accordance with a first embodiment of the present invention for fastening a heat sink to a CPU mounted on a ZIF connector.

Referring to FIG. 1, a clip 30 in accordance with a first embodiment of the present invention is formed by stamping a metal sheet. The clip 30 has an elongated body portion 31 with a middle stem 302 and two wings 304, 306 ascending from two extremities of the stem 302. A first arm 32 downward extends from an end of the wing 304 distant from the stem 302. The first arm 32 defines a first rectangular hole 322 in its enlarged free end 324. A second arm 34 downward extends from an end of the wing 306 distant from the stem 32. The second arm 34 defines a second rectangular hole 342 in its free end 344. The second arm 34 further has a pair of guiding walls 346 projecting upwardly from two lateral edges of the second arm 34. The guiding walls 346 cooperatively define a guiding channel 348 therebetween. A pair of tabs 350 is integrally formed with the guiding walls and projects toward each other about a middle portion of the guiding walls 346. A plastic handle portion 352 is insert molded to top edges of the guiding walls 346 by a known method. The handle portion 352 is formed with an arced cutout 354 in communication with the guiding channel 348 and facing the body portion 31. The handle portion 352 is formed with a rough surface for facilitating a person's fingers to grip it.

A rectangular ZIF connector 80 is used to be soldered to a printed circuit board (not shown). The connector 80 has a pair of lugs 82 formed on opposite sides of the connector 80. A CPU 70 is used to be mounted to the connector 80 to achieve an electrical connection with the printed circuit board. A heat sink 60 is made by aluminum extrusion to have a base 62 for contacting with the CPU 70. A number of heat dissipating fins 64 project from the base 62 for enhancing heat dissipating effectiveness of the heat sink 60. A trench 66 is defined in the heat dissipating fins 64. Like the prior art, when the clip 30, the heat sink 60, the CPU 70 and the connector 80 are assembled together, the end 324 of the clip 30 firmly engages with a corresponding lug 82 of the connector 80 by the lug 82 fitting within the hole 322, and the end 344 firmly engages with the other lug 82 by the other lug 82 fitting within the hole 342. The stem 302 extends into the trench 66 and presses the base 62 against the CPU 70, thereby causing the heat sink 60 and the CPU 70 to have a tight contact.

Figure 4:
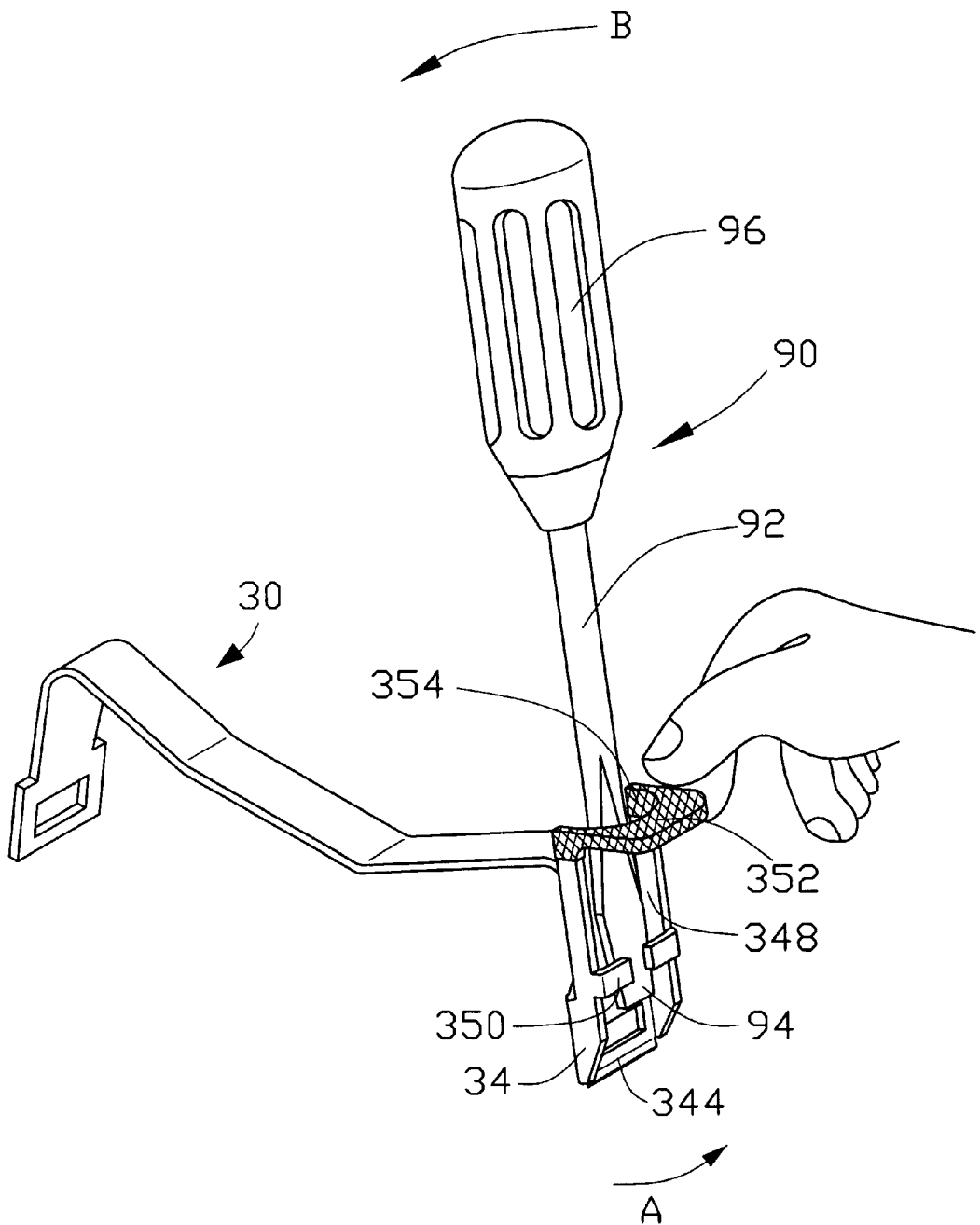
FIG. 4 is a perspective view showing two possible options for manipulating the clip of FIG. 3.

To detach the heat sink 60 from the CPU 70, referring to FIG. 4, a user may directly use his (her) fingers to manipulate the plastic handle portion 352 to cause the end 344 of the second arm 34 to move in a direction indicated by "A" away from the corresponding lug 82, whereby the connection between the clip 30 and the connector 80 is released. Alternatively, a tool, for example, a flat screwdriver 90 can be used by extending a stem 92 of the screwdriver 90 into the guiding channel 348 via the cutout 354 to reach a position wherein a blade 94 of the screwdriver 90 abuts against the tabs 350. Then, a force is exerted to a handle 96 of the screwdriver 90 in a direction as indicated by "B" to cause the end 344 of the second arm 34 of the clip 30 to move in the direction "A" to disengage from the corresponding lug 82.

Figure 5:
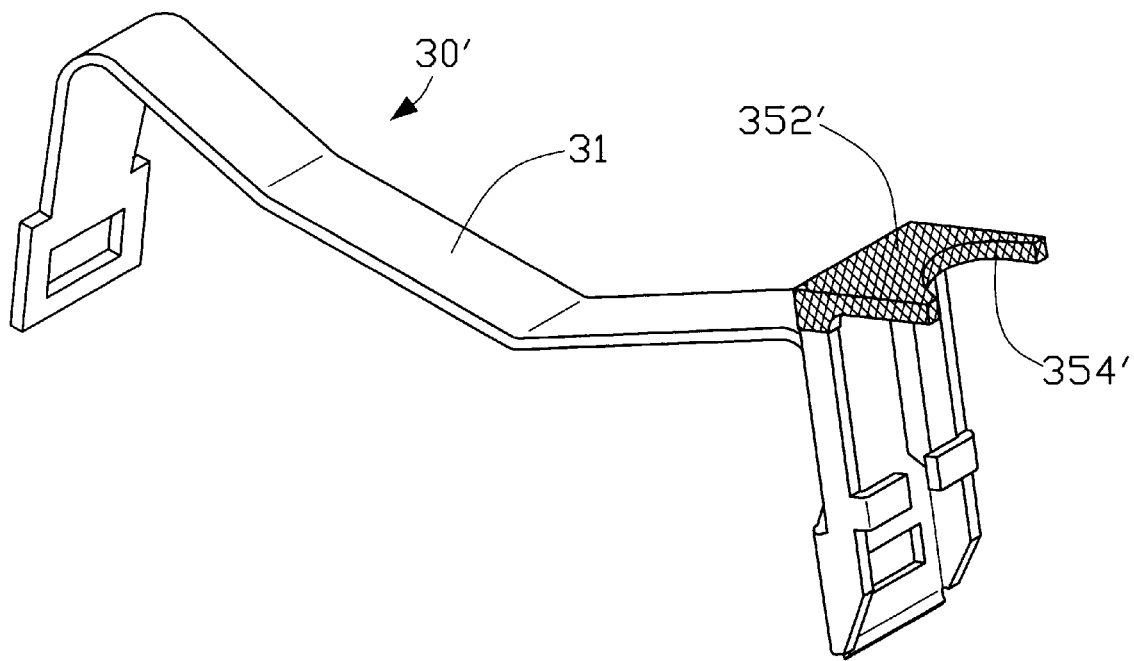
FIG. 5 is a perspective view of a clip in accordance with a second embodiment of the present invention.

FIG. 5 shows a clip 30' in accordance with a second embodiment of the present invention. Except the configuration of the plastic handle portion, the clip 30' in accordance with the second embodiment is substantially the same as the clip 30 in accordance with the first embodiment. In the second embodiment, the clip 30' has a plastic handle portion 352' with an arced cutout 354' facing a direction opposite the elongated body portion 31. The user can manipulate the clip 30' by use of his (her) fingers directly exerting the operating force to the handle portion 352'.

Figure 6:
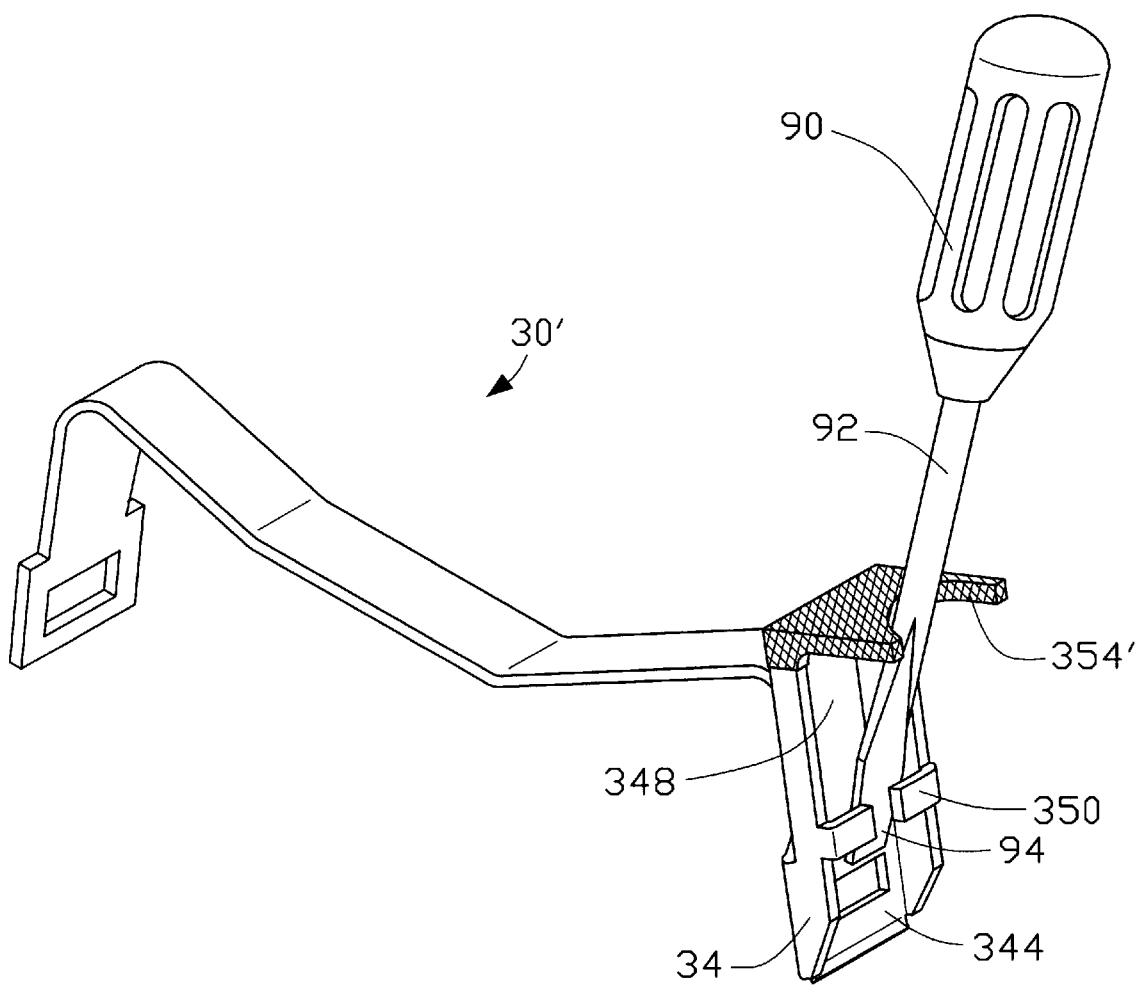
FIG. 6 is a perspective view showing how a tool is used to manipulate the clip of FIG. 5.

FIG. 6 shows how the screwdriver 90 is used to manipulate the clip 30'. The stem 92 of the screwdriver 90 is extended into the guiding channel 348 via the cutout 354' to a position in which the blade 94 of the screwdriver 90 abuts against the tabs 350. The operating manner of screwdriver 90 in the second embodiment to release the engagement between the end 344 of the second arm 34 of the clip 30' and the corresponding lug 82 of the connector 80 is the same as the first embodiment.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A device for fastening a heat sink to a central processing unit mounted on a connector having two lugs on its two opposite sides, said device comprising:

an elongate body portion for pressing the heat sink toward the central processing unit;

a first arm extending downward from a first end of the body portion, defining first means for engaging with one of the lugs;

a second arm extending downward from a second end of the body portion opposite the first end, defining second means for engaging with the other lug;

third means disposed on the second arm for receiving a manipulating force exerted directly by fingers of an operator; and fourth means disposed on the second arm and located between the third means and the second means for receiving a manipulating force of the clip exerted by the operator through a use of a tool.

2. A clip for fastening a heat sink to a CPU mounted on a connector having two lugs on two opposite sides thereof, said clip comprising:

an elongated body portion having a middle stem for pressing the heat sink toward the CPU, two wings ascending from two extremities of the stem;

a first arm extending downward from an end of a corresponding wing distant from the stem, said first arm defining a hole near its free end for fitting with a corresponding lug of the connector;

a second arm extending downward from an end of the other wing distant from the stem, said second arm defining a hole near its free end for fitting with the other lug of the connector;

a handle portion being attached to the second arm for receiving a manipulating force directly exerted by fingers of an operator; and means formed by the second arm and located between the hole of the second arm and the handle portion for receiving the manipulating force of the clip from a tool.

3. The clip in accordance with claim 2, wherein the means for receiving the manipulating force of the clip from a tool comprises at least a tab integrally formed with the second arm.

4. The clip in accordance with claim 2, wherein the second arm comprises a pair of guiding walls projecting from two lateral edges of the second arm, said guiding walls defining a guiding channel therebetween, said means for receiving the manipulating force of the clip from a tool comprises a pair of tabs extending from the guiding walls toward each other.

5. The clip in accordance with claim 4, wherein the handle portion is made by plastic insert molding to top edges of the guiding walls.

6. The clip in accordance with claim 5, wherein the handle portion has a cutout facing the elongated body portion and in communication with the guiding channel.

7. The clip in accordance with claim 5, wherein the handle portion has a cutout facing a direction opposite the elongate body portion.

8. An electrical device assembly, comprising:
- a rectangular connector having a first lug on a first side and a second lug on a second side opposite the first side;
- a CPU mounted on the connector;
- a heat sink attached to the CPU, said heat sink having a base in contact with the CPU, a number of heat dissipating fins projecting from the base, and a trench defined in the fins;
- a clip having an elongated body portion extending into the trench to tightly press the base against the CPU, a first arm extending downward from a first end of the body portion toward the first lug of the connector and having a firm fit therewith, a second arm extending downward from a second end of the body portion toward the second lug and having a firm fit therewith, a first operating portion being formed at the second arm near the second end for receiving a manipulating force directly exerted by fingers of a user of the electrical device assembly, and a second operating portion being formed at the second arm below the first operating portion for receiving the manipulating force of the clip from a tool.

9. The electrical device assembly in accordance with claim 8, wherein the second operating portion comprises a pair of tabs integrally extending from two lateral edges of the second arm toward each other.

10. The electrical device assembly in accordance with claim 9, wherein the first operating portion comprises a plastic molded handle defining a cutout facing the body portion of the clip.

11. The electrical device assembly in accordance with claim 9, wherein the first operating portion comprises a plastic molded handle defining a cutout facing a direction opposite the body portion of the clip.

* * * * *